United States Patent
Suzuki et al.

(10) Patent No.: US 8,362,805 B2
(45) Date of Patent: Jan. 29, 2013

(54) POWER SWITCH RAMP RATE CONTROL USING DAISY-CHAINED FLOPS

(75) Inventors: Shingo Suzuki, San Jose, CA (US); Vincent R. von Kaenel, Palo Alto, CA (US); Toshinari Takayanagi, San Jose, CA (US); Conrad H. Ziesler, Seattle, WA (US); Daniel C. Murray, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 494 days.

(21) Appl. No.: 12/705,834

(22) Filed: Feb. 15, 2010

(65) Prior Publication Data

US 2011/0198941 A1 Aug. 18, 2011

(51) Int. Cl.
*H03K 193/00* (2006.01)
*H03B 21/00* (2006.01)

(52) U.S. Cl. ........... 326/93; 326/21; 326/95; 326/98; 327/107; 327/113; 327/115

(58) Field of Classification Search ............ 326/21, 326/93, 95–98; 327/107, 113, 115, 291, 327/295, 298
See application file for complete search history.

(56) References Cited

U.S. PATENT DOCUMENTS

| | | | | |
|---|---|---|---|---|
| 6,980,042 B2 * | 12/2005 | LaBerge | | 327/291 |
| 7,046,052 B1 * | 5/2006 | Percey et al. | | 327/115 |
| 7,126,370 B2 * | 10/2006 | Bhattacharya | | 326/33 |
| 7,190,187 B2 | 3/2007 | Hua et al. | | |
| 7,304,512 B2 * | 12/2007 | Duvillard et al. | | 327/113 |
| 7,411,423 B2 | 8/2008 | Berthold et al. | | |
| 7,420,388 B2 * | 9/2008 | Bhattacharya | | 326/33 |
| 7,479,801 B2 * | 1/2009 | Bhattacharya | | 326/33 |
| 7,605,631 B2 * | 10/2009 | LaBerge | | 327/291 |
| 7,659,746 B2 * | 2/2010 | Chua-Eoan et al. | | 326/83 |
| 7,716,609 B1 | 5/2010 | Taheri | | |
| 8,026,741 B2 * | 9/2011 | Takayanagi | | 326/83 |
| 8,120,208 B2 * | 2/2012 | Takayanagi et al. | | 307/113 |
| 2004/0184289 A1 | 9/2004 | Vinciarelli | | |
| 2006/0055391 A1 * | 3/2006 | Kuang et al. | | 323/371 |
| 2006/0261855 A1 | 11/2006 | Hillman et al. | | |
| 2008/0093632 A1 | 4/2008 | Sakurabayashi | | |

(Continued)

OTHER PUBLICATIONS

J.B. Kuang, et al., "The Design and Implementation of a Low-Overhead Supply-Gated SRAM," IEEE, 2006, pp. 287-290.

(Continued)

*Primary Examiner* — Vibol Tan
(74) *Attorney, Agent, or Firm* — Lawrence J. Merkel; Meyertons, Hood, Kivlin, Kowert & Goetzel, P.C.

(57) ABSTRACT

In an embodiment, an integrated circuit may include one or more power managed blocks and a power manager circuit. The power manager circuit may be configured to generate a block enable for each power managed block and a block enable clock. The power managed block may generate local block enables to various power switches in the power managed block, staggering the block enables over two or more block enable clock cycles. In particular, the power managed block may include a set of series-connected flops that receive the block enable from the power manager circuit. The output of each flop may be coupled to a respective set of power switches and may enabled those switches. The change in current flow due to enabling and/or disabling the power managed block may thus be controlled. In an embodiment, the frequency of the block enable clock may be set to a defined value independent of process, voltage, and temperature conditions in the integrated circuit.

22 Claims, 8 Drawing Sheets

U.S. PATENT DOCUMENTS

2009/0066164 A1     3/2009    Flynn et al.
2009/0160253 A1     6/2009    Rao et al.
2009/0268531 A1   10/2009   Nii et al.

OTHER PUBLICATIONS

U.S. Appl. No. 12/705,837, filed Feb. 15, 2010.

U.S. Appl. No. 12/879,772, filed Sep. 10, 2010.

International Search Report and Written Opinion in Application No. EP 11179367.5-2215 I 2429079 Issued on Sep. 26, 2012, pp. 1-7.

International Search Report and Written Opinion in Application No. PCT/US 11/48998 Issued on Jan. 10, 2012, pp. 1-8.

\* cited by examiner

POWER SWITCH RAMP RATE CONTROL USING DAISY-CHAINED FLOPS

BACKGROUND

1. Field of the Invention

This invention is related to the field of integrated circuits, and more particularly to supplying power to circuitry in integrated circuits.

2. Description of the Related Art

As the number of transistors included on an integrated circuit "chip" continues to increase, power management in the integrated circuits continues to increase in importance. Power management can be critical to integrated circuits that are included in mobile devices such as personal digital assistants (PDAs), cell phones, smart phones, laptop computers, net top computers, etc. These mobile devices often rely on battery power, and reducing power consumption in the integrated circuits can increase the life of the battery. Additionally, reducing power consumption can reduce the heat generated by the integrated circuit, which can reduce cooling requirements in the device that includes the integrated circuit (whether or not it is relying on battery power).

Clock gating is often used to reduce dynamic power consumption in an integrated circuit, disabling the clock to idle circuitry and thus preventing switching in the idle circuitry. While clock gating is effective at reducing the dynamic power consumption, the circuitry is still powered on. Leakage currents in the idle transistors lead to static power consumption. The faster transistors (those that react to input signal changes, e.g. on the gate terminals) also tend to have the higher leakage currents, which often results in high total leakage currents in the integrated circuit, especially in high performance devices.

To counteract the effects of leakage current, some integrated circuits have implemented power gating. With power gating, the power to ground path of the idle circuitry is interrupted, reducing the leakage current to near zero. There can still be a small amount of leakage current through the switches used to interrupt the power, but it is substantially less than the leakage of the idle circuitry as a whole.

Power gating presents challenges to the integrated circuit design. As blocks are powered up and powered down, the change in current flow to the blocks can create noise on the power supply connections. The noise can affect the operation of the integrated circuit, including causing erroneous operation. Additionally, the rate of change in the current flow varies with process variations in the semiconductor fabrication process, and can also vary with the magnitude of the supply voltage supplied to the integrated circuit and with the operating temperature of the integrated circuit. When these factors slow the rate of change of the current, the delay to enable a power gated block increases. Accordingly, balancing the delay to enable the power gated blocks and the power supply noise is challenging.

SUMMARY

In an embodiment, an integrated circuit may include one or more power managed blocks and a power manager circuit. The power manager circuit may be configured to generate a block enable for each power managed block and a block enable clock. The power managed block may generate local block enables to various power switches in the power managed block, staggering the block enables over two or more block enable clock cycles. In particular, the power managed block may include a set of series-connected flops that receive the block enable from the power manager circuit. The output of each flop may be coupled to a respective set of power switches and may enable those switches. The change in current flow due to enabling and/or disabling the power managed block may thus be controlled. In an embodiment, the frequency of the block enable clock may be set to a defined value independent of process, voltage, and temperature conditions in the integrated circuit.

BRIEF DESCRIPTION OF THE DRAWINGS

The following detailed description makes reference to the accompanying drawings, which are now briefly described.

Figure 1:
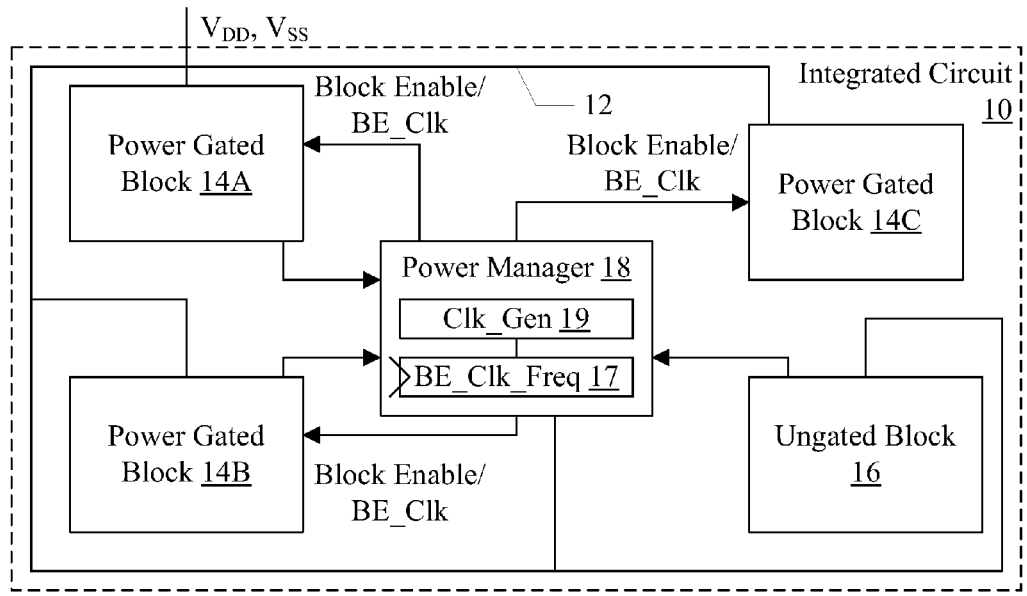
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/ components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit 10 is shown. The integrated circuit 10 is coupled to receive power supply inputs (e.g. $V_{DD}$ and $V_{SS}$, or power and ground, respectively). The $V_{DD}$ voltage may have a specified magnitude measured with respect to ground/$V_{SS}$ during use. More particularly, the $V_{DD}$ voltage may have a number of magnitudes that may be used for different operating points of the integrated circuit 10 during use. The integrated circuit 10 may include an interconnect, e.g. a global power supply grid, for each supply voltage, to distribute the voltage over an area occupied by the integrated circuit 10 (e.g. an area at the surface of a semiconductor substrate such as silicon). The global power supply grids are illustrated in FIG. 1 as the line 12 coupled to the blocks 14A-14C, 16, and 18 in FIG. 1. However, the grids may physically be arranged in a somewhat regular fashion, as described in more detail below.

The integrated circuit 10 may include one or more power gated circuit blocks such as blocks 14A-14C. Each block 14A-14C may include circuitry such as transistors that are arranged to implement the desired operations of the integrated circuit 10, and thus may be circuit blocks (although sometimes referred to herein as simply "blocks" for brevity). For example, the blocks 14A-14C may be processors or portions thereof (e.g. execution units within the processors); interface circuitry; peripheral circuitry such as graphics processing circuitry; user interface circuitry; multimedia circuitry such as audio and/or video processing circuitry; etc.

Generally, a circuit block may include a set of related circuits that implement one or more identifiable operations. The related circuits may be referred to as logic circuits or logic circuitry, since the circuits may implement logic operations on inputs to generate outputs. Because the circuits in a given circuit block are related, they may be powered up or powered down as a unit. Each circuit block may generally be treated as a unit during the design of the integrated circuit (e.g. being physically placed within the integrated circuit as a unit). The circuit block may further include memory circuitry (e.g. various static random access memories, or SRAMs) and other storage devices that are part of the logic circuitry.

A power gated circuit block (or simply a power gated block) may be a circuit block that may have at least one of its power supply voltages ($V_{DD}$ or $V_{SS}$) interrupted in response to deassertion of a block enable input signal. The power gated blocks may include power switches that are coupled to the global power supply grid and to a local power supply grid. If the enable is asserted, the power switches may electrically connect the global and local power supply grids. If the enable is deasserted, the power switches may electrically isolate the global and local power supply grids. When electrically connecting the grids, the power switch may be referred to as being on, and when electrically isolating the grids, the power switch may be referred to as being off. The voltage on the global power supply grid may appear on the local supply grid when electrically connected. However, the switches may have some impedance, and thus the voltage on the local power supply grid may differ from the voltage on the global power supply grid. The local supply voltage may be referred to as "virtual" (e.g. virtual $V_{DD}$ or virtual $V_{SS}$).

When a power gated block 14A-14C is enabled, the power switches turn on and current flows to charge the local power supply grid in the power gated block 14A-14C. In order to reduce the rate of change of current (di/dt) on the global power supply grids, which may generate enough noise to cause erroneous behavior in other circuitry in some cases, the power gated block 14A-14C may stagger the turn on of the power switches. Particularly, in the illustrated embodiment, the power gated blocks 14A-14C may receive a clock signal (BE_Clk in FIG. 1) in addition to the block enable. The power gated block 14A-14C may enable a different subset of the power switches in each clock cycle of the BE_Clk, thus reducing the rate of change of the current as compared to concurrently enabling the entire set of power switches. By controlling the frequency of the BE_Clk, the rate of change of the current may be controlled to acceptable levels, in some embodiments. More particularly, the power gated block 14A-14C may include a series-coupled set of flops or other clocked storage devices that are controlled by the BE_Clk. Each flop may be coupled to a respective subset of the power switches and may provide an enable to the subset responsive to the block enable and the BE_Clk from the power manager 18.

In the illustrated embodiment, the power manager 18 may include a clock generator circuit 19 that generates the BE_Clk clock. The frequency of the clock may be programmable (e.g. via software executing on a processor within the IC 10 or coupled to the IC 10) via the BE_Clk_Freq register 17 coupled to the clock generator circuit 19. In some embodiments, the programmed frequency may be independent of process/voltage/temperature (PVT) conditions in the integrated circuit. For example, the delay for power switches enabled by one flop in the power gated block may be determined for the fastest PVT conditions, and a frequency corresponding to ½ of the delay may be selected as the programmable frequency. Additional details for some embodiments are provided below. In other embodiments, the frequency programmed into the register 17 may be based on an indication of the process parameters that were in place when the integrated circuit 10 was manufactured (e.g. the parameters may indicate a "fast" process, a "typical" process, or a "slow" process). The frequency may be also be based on the current supply voltage magnitude. A lower voltage may lead to slower transistor operation, reducing the di/dt effect as compared to higher voltages and thus permitting a higher frequency, if desired. In some embodiments, the frequency may also be based on operating temperature. A higher operating temperature may lead to slower transistor operation, reducing the di/dt effect as compared to lower temperatures and thus permitting a higher frequency, if desired. The clock generator circuit 19 may be any type of clock generator (e.g. a phase locked loop, a clock divider receiving an input clock and dividing it in frequency, a clock multiplier, etc.).

A power manager 18 is coupled to the blocks 14A-14C and 16, and may be configured to monitor the activity in the blocks 14A-14C and 16 to generate the block enables for the power gated blocks 14A-14C. The activity in one block may be an indicator that another block is about to become active and should be powered up. For example, the blocks 14A-14C and 16 may be part of a pipeline. If one pipeline stage is active, it may be likely that the next stage will be active soon. Similarly, in a processor, a fetch request may indicate that instructions will be fetched and decoded soon, and thus the execution units may be powered up. Power gated blocks may be components of a system on a chip, and a communication from one component to another may indicate that a block may need to be powered up. Activity in a block may also indicate that the block or another block is about to be idle and may be powered down. While the ungated block may not be enabled or disabled for power gating, its activity may be useful in determining if the power gated blocks may be disabled. In some embodiments, clock gating may be implemented in addition to power gating. In such embodiments, the power manager 18 may also implement the clock gating, or the clock gating may be implemented separately. While the power manager is shown as a block in FIG. 1, the power manager 18 may actually be distributed as desired.

Generally, the power manager 18 may be configured to deassert the block enable to power down a block, and to assert the block enable to power up a block. The block enable (and other signals described herein) may be asserted at one logical state and deasserted at the other logical state. For example, the signal may be asserted (indicating enable) at a low logical state (binary zero) and deasserted at a high logical state (binary one). The signal may alternatively be deasserted at the low logical state and asserted at the high logical state. Different signals may have different asserted/deasserted definitions. In some contexts, a signal may be referred to as asserted low, or alternatively asserted high, for additional clarity.

In various embodiments, a period of time may elapse after a power gated block 14A-14C has its block enable deasserted before the supply voltage has drained, and there may be a period of time after assertion of the enable before the power gated block is considered stable and ready for use. The power manager 18 may be configured to account for these times when determining if the block enable may be deasserted, and in determining when to reassert the block enable for the next power up of the block.

The electrical isolation of the local and global power supply grids that may be provided by the power switches may generally refer to a lack of active current flow between the grids. The power switches themselves may have leakage current, so there may be some leakage current flow. Similarly, the electrical connection of the local and global power supply grids may refer to an active current flow between the grids to provide the voltage from the global grid to the local grid. Viewed in another way, electrically connected grids may have a very low impedance path between them, whereas electrically isolated grids may have a very high impedance path. Viewed in still another way, electrically connected grids may be actively passing a voltage from one grid to the other, wherein electrically isolated grids may be preventing the passing of the voltage.

The local and global power supply grids may generally distribute a power supply voltage over various areas of the integrated circuit 10. The global power supply grids distribute the voltage over the entire area of the integrated circuit 10, while local power supply grids distribute power supply voltages within a power gated block. The ungated blocks may also include local power supply grids, but since they do not include power switches, the local power supply grids may essentially be part of the global power supply grid. In general, the power supply grids may have any configuration. For example, in one embodiment, a given block may have power supply connections to the underlying circuitry at certain physical locations (e.g. regularly spaced channels over the area). The power supply grids may include wiring running above these regularly spaced channels. There may also be wires running in the orthogonal direction to the wiring, to reduce impedance and to supply current to any localized current "hot spots". Other grids may include any sort of distribution interconnect and/or there may be irregularities in the grids, or the interconnect may essentially be a plane of metal. In one embodiment, the global power supply grids may be provided in one or more of the highest layers of metal (wiring layers), i.e. those layers that are farthest from the surface of the semiconductor substrate. The local power supply grids may be included in lower layers of metal. Connections between the power supply grids may be made to the power switches at a surface of the semiconductor substrate. The metal may be any conductive material used for interconnect in the semiconductor fabrication process used to fabricate the integrated circuit 10. For example, the metal may be copper, aluminum, tungsten, combinations thereof (e.g. aluminum or copper wiring layers and tungsten vias), alloys thereof, etc.

The power supply voltages ($V_{DD}$ and $V_{SS}$) may generally be externally supplied to the integrated circuit, and may be generally intended to be relatively static during use. While the magnitude of the supply voltages may be intentionally changed during use (e.g. for power management), the magnitude changes are not intended to be interpreted by receiving circuits in the fashion that dynamically varying signals are interpreted. Similarly, local variations in the power supply voltages may occur (such as $V_{DD}$ droop or $V_{SS}$ bounce) during operation, but these variations may generally be undesirable transients. The power supply voltages may serve as sources and sinks of current as the circuitry evaluates.

As mentioned above, the power gated blocks 14A-14C may have their power gated, e.g. when inactive, to reduce power consumption in the integrated circuit. According, the power gated blocks 14A-14C are each coupled to receive an enable signal (block enable in FIG. 1). The block enable signal for each block may be a separate, unique signal for that block, so that the power gated blocks 14A-14C may be individually enabled or not enabled. In some cases, one or more power gated blocks may share an enable. A shared block enable may be physically the same signal, or logically the same signal (i.e. the signals are physically separate by logically operated the same way). The integrated circuit 10 may also include one or more ungated circuit blocks such as ungated block 16. Ungated blocks may be coupled to the power supply grids 12 without any power switches, and thus may be powered up whenever the integrated circuit 10 is powered up. Ungated blocks may be blocks that are active most or all of the time, so that including the power switches and attempting to power gate them is not expected to produce much power savings, if any, for example.

It is noted that, while one ungated block and three power gated blocks are shown in FIG. 1, there may generally be any number of one or more power gated blocks and ungated blocks, in various embodiments. Similarly, there may be more than one power manager 18 in the integrated circuit 10 (e.g. enabling/disabling various non-overlapping subsets of the power gated blocks).

It is noted that one or more circuit blocks may include state storage (e.g. memory, flops, registers). It may be desirable to retain the state in the state storage (or some of the state storage). In such cases, the global power grids may supply power to the state storage without power switches in the power to ground path. A separate local power grid may be provided, for example, without power switches.

Figure 2:
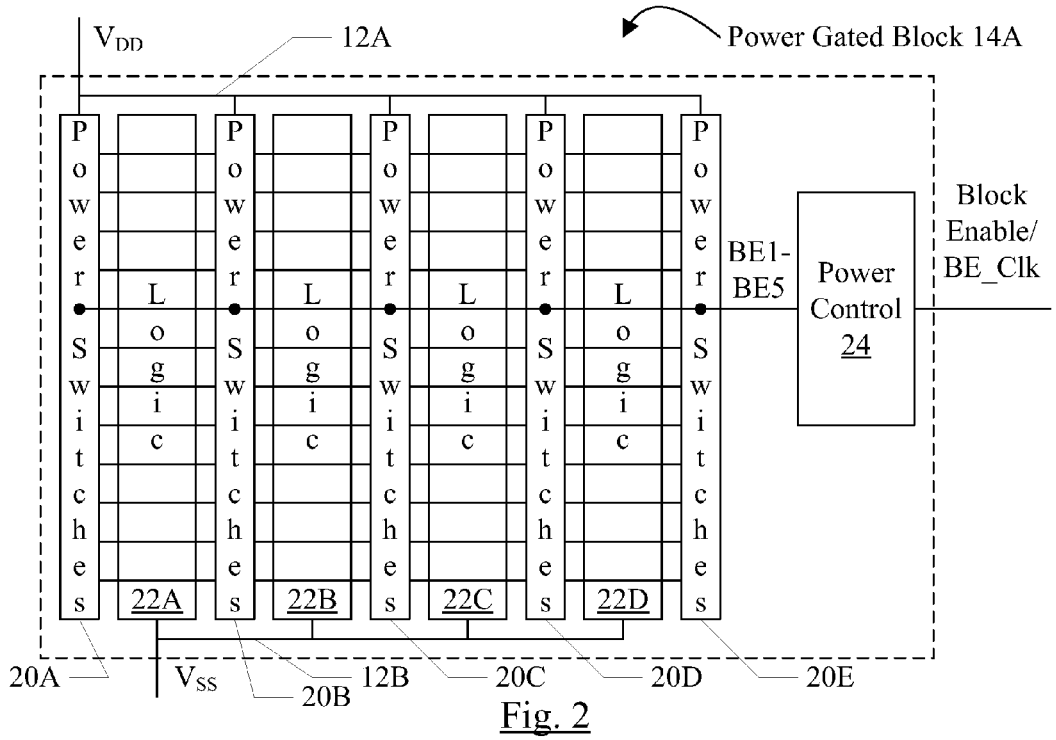
FIG. 2 is a block diagram of one embodiment of a power gated block shown in FIG. 1.

Turning now to FIG. 2, a block diagram of one embodiment of the power gated block 14A is shown. Other power gated blocks 14B-14C may be similar. In the embodiment of FIG. 2, the power gated block 14A includes multiple power switches located at a variety of physical locations within the power gated block 14A, as illustrated. That is, the power switches may be physically distributed over the area occupied by the power gated block 14A. In this embodiment, the power switches are placed at regularly spaced intervals, although other distributions that are not regular may be used in other embodiments. Each location may include multiple power switches (e.g. power switch segment 20A may include multiple power switches). The power switches at one location may be referred to as a segment of power switches 20A-20E. The power gated block 14A further includes a power control circuit 24. The power control circuit 24 is illustrated as a block in FIG. 2, but may be physically distributed near the locations of the power switch segments in some embodiments. The block enable and BE_Clk for the power gated block 14A are coupled to the power control circuit 24. The power control circuit 24 is coupled to each of the power switch segments 20A-20E, supplying each segment with a respective local block enable (BE1 to BE5 in FIG. 2).

In this embodiment, the power switches are coupled between the global $V_{DD}$ grid 12A and the local $V_{DD}$ grid of the power gated block 14A. The local $V_{DD}$ grid is illustrated as the horizontal lines in FIG. 2 between the power switch segments 20A-20E. Between each of the power switch segments 20A-20E, logic circuits 22A-22D are provided. The logic circuits 22A-22D may be powered by the local $V_{DD}$ grid, and also by the local $V_{SS}$ grid which is not shown in FIG. 2. The global $V_{SS}$ grid 12B is shown coupled to each of the logic circuits 22A-22E, but there may generally be a local $V_{SS}$ grid to which the global $V_{SS}$ grid 12B is coupled. While FIG. 2 shows the power switch segments 20A and 20E at the edges of the power gated block 14A with no circuitry between the edges of the power gated block 14A and the power switch segments 20A and 20E, these power switch segments may not necessarily be placed at the very edges. In other words, logic circuits may be placed to the left of the power switch segment 20A in FIG. 2 and/or to the right of power switch segment 20E in FIG. 2.

The power control circuit 24 may generate the local block enables BE1-BE5 for the segments responsive to the block enable and BE_Clk from the power manager 18. Particularly, the power control circuit 24 may stagger the local block enable assertions. For example, the power control circuit 24 may assert one local block enable per clock cycle of the BE_Clk. In other embodiments, more than one local block enable may be asserted per clock cycle, as long as the di/dt effects of enabling more than one segment per clock cycle are below design limits. Furthermore, in some embodiments, there may be more than one local block enable per segment, and the local block enables for a given segment may be staggered. The number of segments and local block enables in a power gated block may be varied and may be more or fewer than that shown in FIG. 2.

The power switches may generally comprise any circuitry that may electrically connect a local power supply grid to a global power supply grid in response to an asserted enable signal and may electrically isolate the local power supply grid from the global power supply grid in response to a deasserted enable signal. For example, each power switch may be a P-type Metal-Oxide-Semiconductor (PMOS) transistor for embodiments that implement power switches on the $V_{DD}$ power supply grid. The gate of the PMOS transistor may be coupled to receive the (possibly buffered) local block enable signal (BE1-BE5 in FIG. 2), a source coupled to the global $V_{DD}$ grid 12A, and a drain coupled to one or more local $V_{DD}$ grid lines. Accordingly, the block enable signal may be asserted low in this example, turning the PMOS transistor 24 on and actively conducting current from the global $V_{DD}$ grid 12A to the local $V_{DD}$ grid lines. Embodiments which implement the power switches on the $V_{SS}$ grid may be similar, except that the transistor may be an N-type MOS (NMOS) transistor and the block enable may be asserted high/deasserted low in such embodiments.

Figure 3:
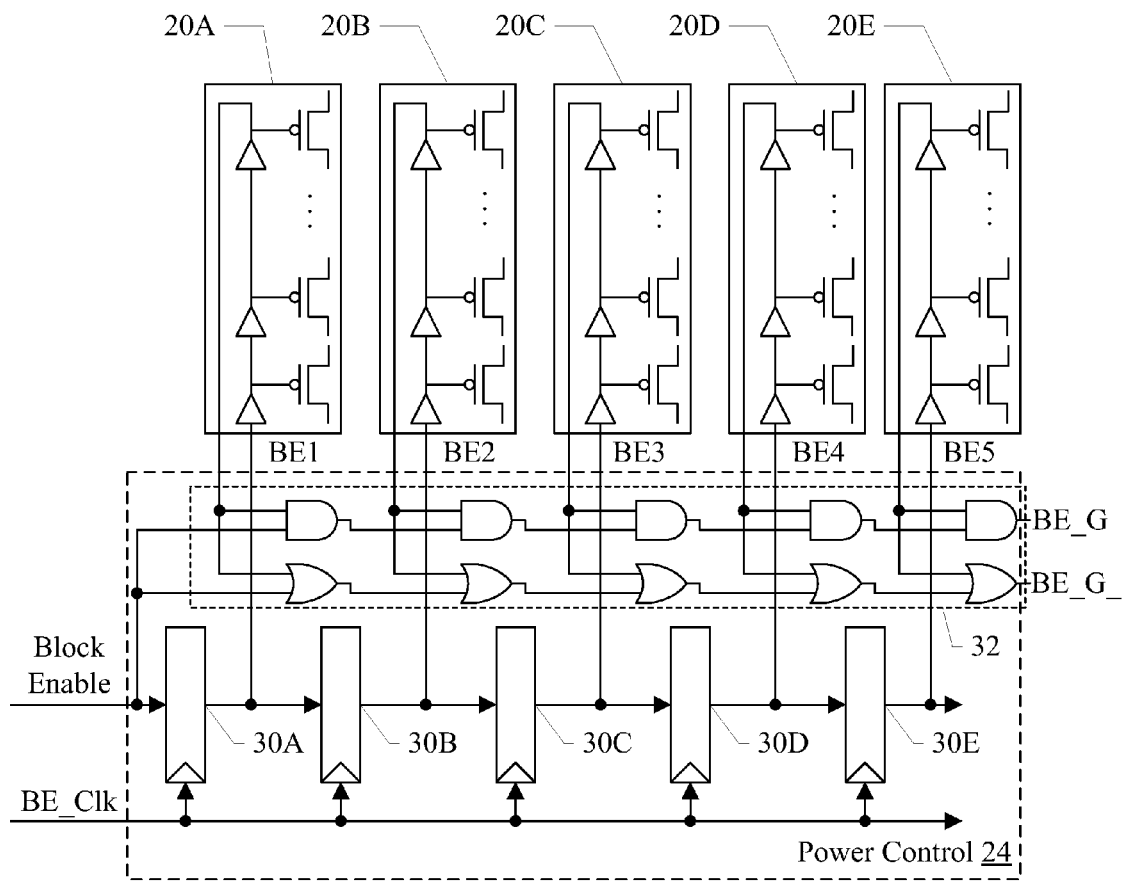
FIG. 3 is a block diagram illustrating one embodiment of a power control circuit and one embodiment of power switches for a power gated block shown in FIG. 2.

Turning next to FIG. 3, a block diagram illustrating one embodiment of the power control circuit 24 and the power switch segments 20A-20E in greater detail is shown. In the illustrated embodiment, the power control circuit 24 includes a set of clocked storage devices 30A-30E and testability logic 32. Other embodiments may not include the testability logic 32.

A clocked storage device may be any device that is configured to capture input data responsive to a clock signal and to store that data in a stable state until the next capture of data. Clocked storage devices may include flops, registers, latches, etc. Flops will be used as an example for the rest of this description, but in general any clocked storage devices may be used in other embodiments.

The flops 30A-30E are serially-connected to each other. That is, the output of each flop 30A-30E is connected as the input to another flop 30A-30E. For timing purposes, the output of each flop 30A-30E may be buffered and the output of the buffers may be the input to the next flop 30A-30E in the serial connection. In general, any connection the provides a logically equivalent signal output from one of the flops 30A-30E to another one of the flops 30A-30E may be a serial connection of the flops 30A-30E. In some embodiments, such as FIG. 4, another signal may be muxed into the connection for testability reasons. However, in functional mode, the mux may select the output of the flop as the input of the next flop in the serial connection. The connection of the flops may also be referred to as a daisy chain. Specifically, in the illustrated embodiment, the flop 30A is coupled to receive the block enable from the power manager 18; the flop 30B is coupled to receive the output of the flop 30A; the flop 30C is coupled to receive the output of the flop 30B; the flop 30D is coupled to receive the output of the flop 30C; the flop 30E is coupled to receive the output of the flop 30D; etc. The flops 30A-30E are clocked by the BE_Clk. Additionally, the output of each flop 30A-30E may be one of the local block enables BE1 to BE5, as illustrated in FIG. 3. Again, the outputs may be buffered if desired to produce the local block enables.

As illustrated in FIG. 3, the power switch segments 20A-20E may include buffering as well, in addition to the power switches (e.g. the PMOS transistors shown in FIG. 3). Any number of buffers and any number of power switches may be included in a given segment, and different segments may include different numbers of buffers and/or power switches. Each buffer may generally drive more than one power switch.

Together, the buffers and the load of the power switches in each power switch segment 20A-20E may cause a delay in the propagation of the block enable signal through the power switch segment 20A-20E. The power switch segments may be designed so that the propagation delay, in best case PVT conditions, presents a di/dt that is less than or equal to an acceptable di/dt for powering up the power gated block. Best case PVT may generally refer to the conditions that cause the circuitry response to be faster than the other combinations of conditions. That is, the best case process parameters may be parameters that produce circuits that respond the most rapidly. The best case voltage may be the highest supply voltage magnitude that is supported by the integrated circuit 10. The best case temperature may be the lowest temperature supported by the integrated circuit. Similarly, worst case PVT conditions may be the conditions that cause the circuitry to respond slower than other combinations. Thus, the worst case process parameters may produce circuits that respond slowly.

The worst case voltage may be the lowest support voltage magnitude, and the worst case temperature may be the highest supported temperature.

Accordingly, if a power switch segment meets di/dt constraints at best case PVT conditions, and the clock period of the BE_Clk is at least as long as the local block enable propagation delay for the power switch segment, then the enabling of the power switch segments using the flops 30A-30E may meet di/dt constraints. Similarly, if more than one local block enable is used per power segment, the subset of power switches controlled by a given local block enable (and that associated buffering) may be designed so that the di/dt experienced when the enable is asserted meets the di/dt constraints. If two or more power switch segments 20A-20E are enabled using the same local block enable, the power switch segments may be designed so that the combination of the power switch segments meets the di/dt constraints.

In one embodiment, the BE_Clk frequency may be programmed so that the clock period is approximately twice the best case propagation delay. That is, the BE_Clk frequency maybe approximately ½ of the frequency that could be supported at best case PVT conditions. The programmed frequency may be used for any set of PVT conditions (that is, the frequency may be PVT immune). Such a frequency may provide the most rapid ramp rate across the PVT conditions without violating the di/dt constraints across the PVT conditions, in one embodiment. The wakeup time for the power gated block may be the programmed clock period multiplied by the number of flops in the series, plus the worst case delay of one power switch segment.

The programmed frequency may be approximately ½ of the best case frequency because, e.g., the frequency that is exactly ½ of the best case frequency may not be convenient to generate in the integrated circuit 10 based on the clock supplied to the integrated circuit 10. A frequency that is convenient to generate and that is nearest to ½ of the best case frequency among the convenient frequencies may be used, for example. Alternatively, a frequency that is convenient to generate and that is nearest to ½ of the best case frequency and less than ½ of the best case frequency may be used. The additional length of the clock period may provide guard banding for jitter or other clock uncertainty, uncertainty in the timing analysis, etc.

Accordingly, if other than best case PVT conditions exist, the propagation delay for one power switch segment (or local block enable) may not have completed when the next segment has its local block enable asserted. However, in these cases, the di/dt of each segment may be less than that experienced in best case PVT conditions. Thus, the overall di/dt may still meet the di/dt specification.

In other embodiments, the frequency of the BE_Clk may be adjusted based on the PVT conditions actually experienced in the integrated circuit 10.

The testability circuit 32 may be provided to ensure connectivity in the local block enables. As illustrated in FIG. 3, each local block enable BE1-BE5 may be propagated through various buffers, and then may be returned to the testability circuit 32. The testability circuit 32 may include a string of OR gates which logically OR the block enable from the power manager 18 with the returned local block enables, generating a block enable good bar (BE_G_) signal. The testability circuit 32 may also include a string of AND gates which logically AND the block enable from the power manager 18 with the returned local block enables to produce a block enable good signal (BE_G) signal. If the BE_G signal is a logical one in response to a logical one on the block enable from the power manager 18, then either the logical one has successfully propagated through the power switch segments or a stuck-at-one fault exists. Similarly, if the BE_G_ signal is a logical zero in response to a logical zero on the block enable from the power manager 18, then either the logical zero has successfully propagated through the power switch segments or a stuck-at-zero fault exists. If both the BE_G and BE_G_ signals are successfully sampled for corresponding values on the block enable from the power manager 18, then the connectivity of the local block enables is verified. In another embodiment, the flops 30A-30E may be scannable flops. The scan-in of each flop may be coupled to the return path from each respective switch segment, and the flops may be scanned to detect connectivity problems.

While the illustrated embodiment uses a serially-connected set of flops 30A-30E to stagger the block enables within the power gated block, other embodiments may use other configurations. For example, the returned local block enable from the power switch segment may be coupled to the input of the next flop 30A-30E (e.g. the returned BE1 from the power switch segment 20A, coupled as an input to the AND and OR gate of the testability circuit 32 in FIG. 3, may be coupled to the input of the flop 30B; the returned BE2 from the power switch segment 20B may be coupled to the input of the flop 30C; etc.).

In some embodiments, it may be desirable to force a power gated block on or off, effectively bypassing the flops 30A-30E. For example, when the integrated circuit 10 is being powered on as a whole, noise on the power supply grids may not be an issue since the integrated circuit 10 is not in operation. Accordingly, the power gated blocks may be forced on in such a scenario. In some cases, there may be more flops than are needed to ensure di/dt compliance. In such situations, some of the power switch segments may be forced on at the same time as other segments to simulate having fewer flops. Turning off a power gated block may not need to be staggered, since the power may drain away slowly enough that noise on the power supply grids is less than the maximum acceptable noise. Accordingly, the blocks may be forced off when being disabled. Additionally, for testing purposes, the blocks may be forced on or off.

Figure 4:
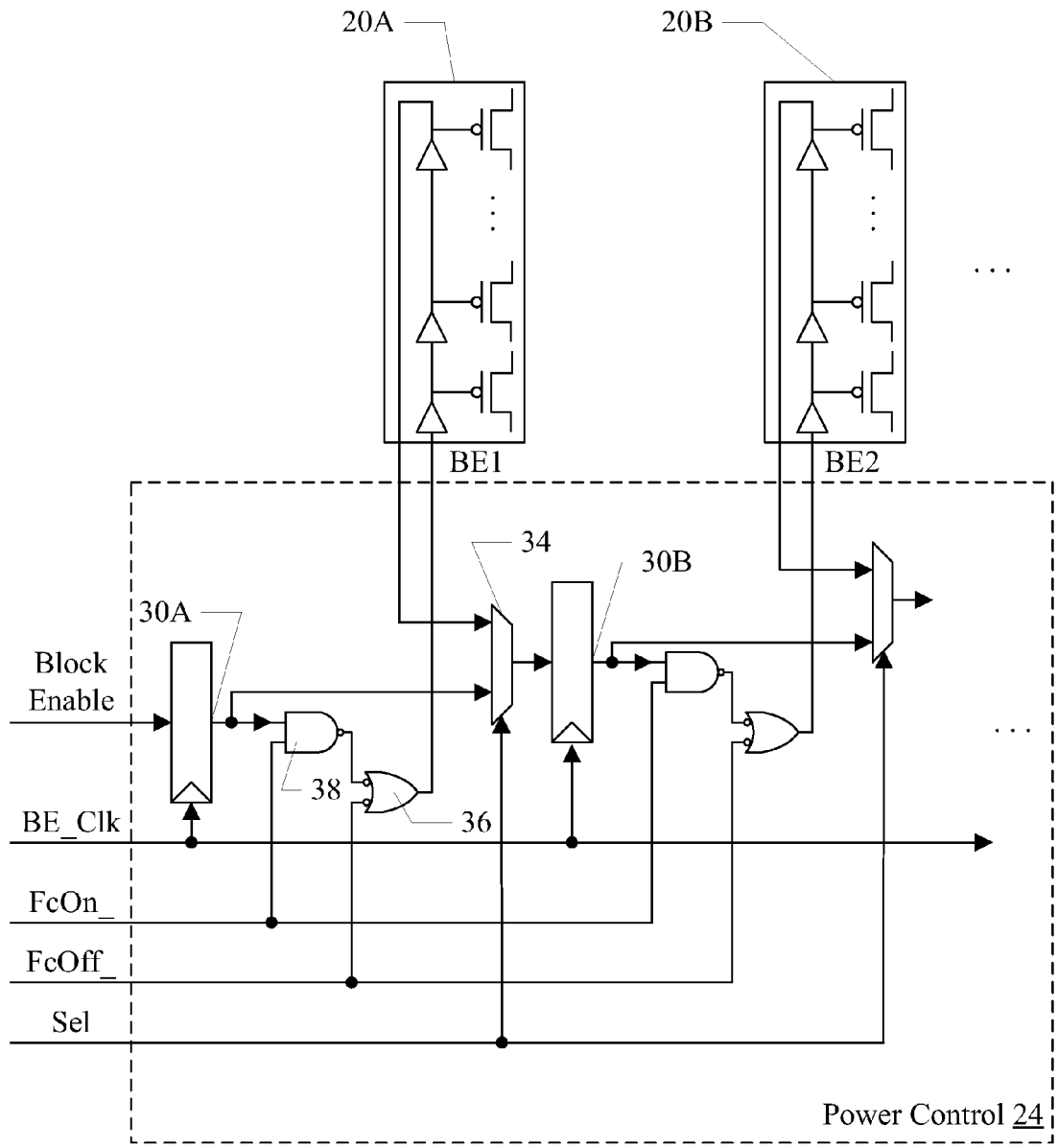
FIG. 4 is a block diagram illustrating another embodiment of a power control circuit and one embodiment of power switches for a power gated block shown in FIG. 2.

FIG. 4 is a block diagram of one embodiment of a portion of the power control circuit 24 and the power switch segments 20A and 20B. The flop 30A and flop 30B are shown in the power control circuit 24. The flop 30A receives the block enable from the power manager 18, and the flops 30A-30B are clocked by the BE_Clk. The output of the flop 30A is connected as an input to a mux 34. The other input of the mux 34 is coupled to receive the return path of the local block enable BE1, and the output of the mux 34 is the input to the flop 30B. Additionally, the output of the flop 30A is coupled to combinatorial logic (e.g. the gates 36 and 38 in FIG. 4). The output of the combinatorial logic is the local block enable BE1.

The combinatorial logic is coupled to receive a force on (FcOn_) and a force off (FcOff_) signal. The power manager 18 may source the force on and force off signals, and may assert the signals (asserted low in this example) to force the power gated block on or off, respectively. Accordingly, the NAND gate 38 may receive the block enable and the FcOn_ signal. If the FcOn_ signal is asserted, the output of the NAND gate 38 is a logical one and the output of the OR gate 36 is a logical zero, enabling the power switch segment 20A by asserting the local block enable (low). If the FcOff_ signal is asserted, the output of the OR gate 36 is a logical one and the power switch segment 20 is disabled. If neither force signal is asserted, the local block enable may be the same as the output of the flop 30A. Accordingly, the local block enable may be generated from the flop output in the embodiment of FIG. 4 (along with the force on and force off signals).

The mux 34 is controlled by a select signal (Sel), and may select between the output of the flop 30A and the return path of the local block enable BE1. During normal operation, the mux 34 may select the output of the flop 30A. For testing (e.g. to ensure connectivity of the local block enable through the power switch segment 20A), the return path of the local block enable may be selected. If a discontinuity occurs, the block enable may not propagate through all of the flops 30A-30E. Additionally, the flops 30A-30E may be scanned out to locate the discontinuity.

Similar circuitry may be used to generate the local block enable BE2 from the output of the flop 30B and to propagate the output of the flop 30B to the flop 30C. Similar circuitry may also be used (not shown in FIG. 4) to propagate the signals through other flops in the series connection of flops.

It is noted that the combinatorial logic shown in FIG. 4 is merely exemplary, and other embodiments may use any combinatorial logic as desired, including any Boolean equivalents of the illustrated logic. Additionally, the logic may be different in different embodiments that use different asserted states for the force on, force off, and/or block enable signals.

The power switch transistors in a given power switch segment need not all be sized the same. For example, some power switch transistors may be sized small (e.g. small channel widths) which may have lower current capacity than larger transistors (e.g. large channel widths) but which may also have lower gate capacitance and thus may be turned on more rapidly. In some embodiments, the smaller transistors may be implemented with lower threshold voltages than the larger transistors as well. In one embodiment, the small transistors may be enabled first, generating a lower di/dt while the local power grid is charged, followed by the larger transistors. Such an embodiment is illustrated in FIG. 5.

Figure 5:
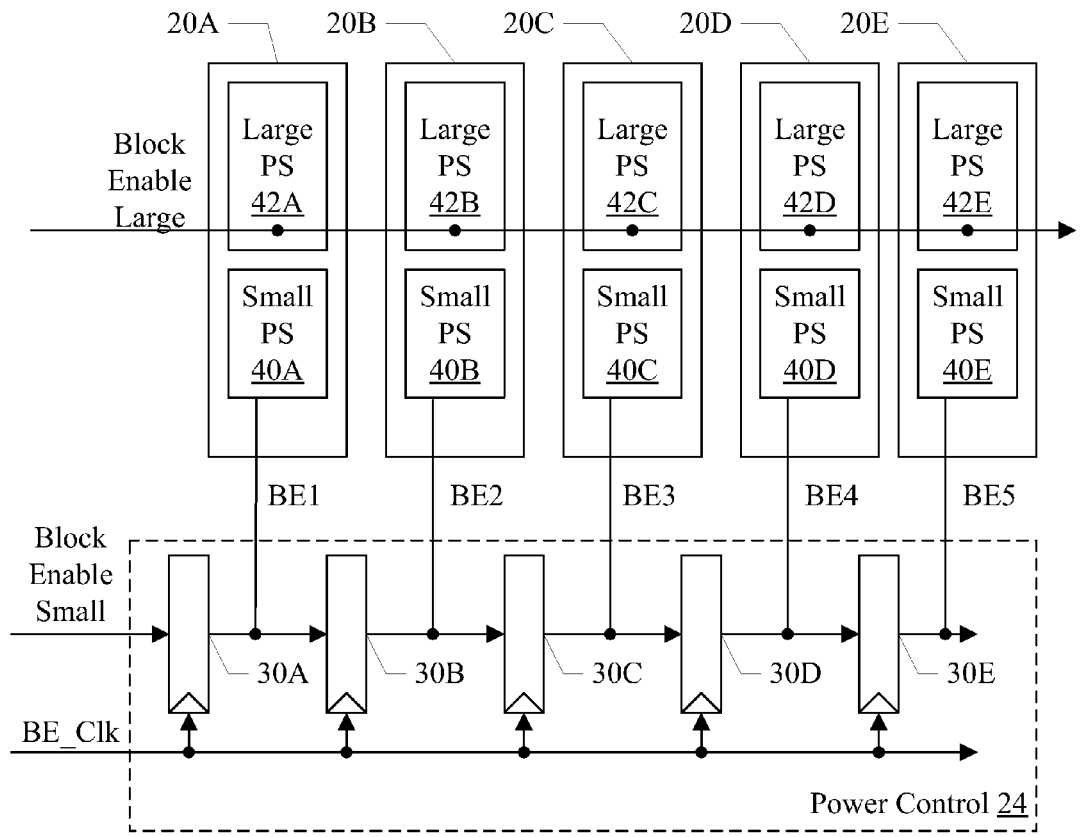
FIG. 5 is a block diagram illustrating yet another embodiment of a power control circuit and one embodiment of power switches for a power gated block shown in FIG. 2.

FIG. 5 is a block diagram of a third embodiment of the power control circuit 24 and the power switch segments 20A-20E. In this embodiment, the power manager 18 may generate a block enable for the small power switch transistors (block enable small in FIG. 5) and a block enable for the large power switch transistors (block enable large in FIG. 5). The block enable small may be staggered through the daisy chained flops 30A-30E clocked by the BE_Clk, producing the BE1-BE5 local block enables. The local block enables are illustrated as coupled to the small power switch transistors 40A-40E in the power switch segments 20A-20E. The large power switch transistors 42A-42E may receive the large block enable directly. Alternatively, there may be an additional flop in the serially-connected flops 30A-30E which may supply the block enable for the large power switch transistors 42A-42E. In such an embodiment, the power manager 18 may supply only the block enable and BE_Clk similar to the embodiment of FIG. 3. There may be buffering including in one or both of the small power switch transistors 40A-40E and the large power switch transistors 42A-42E, as desired, similar to the embodiment illustrated in FIG. 3. In still another embodiment, a second series of flops may be used to transmit the block enable large to each of the larger power switch transistors 42A-42E.

Figure 6:
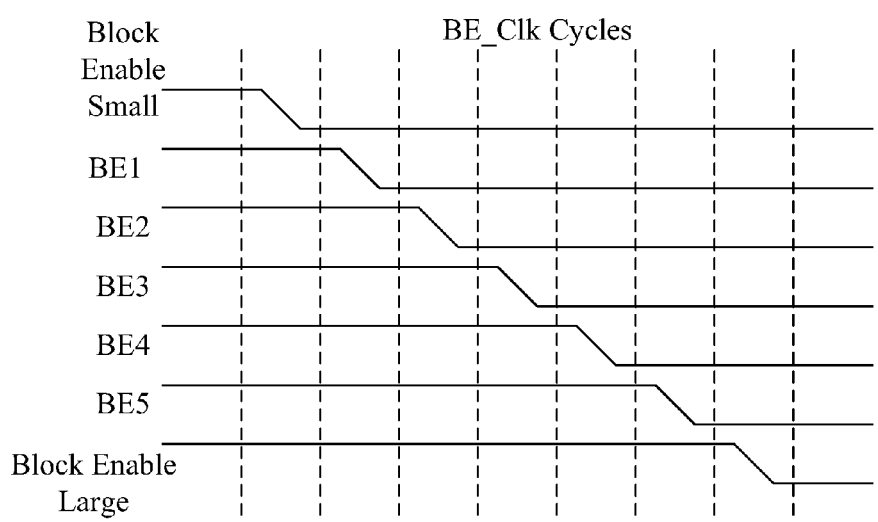
FIG. 6 is a timing diagram illustrating operation of one embodiment of the power control circuit and power switches illustrated in FIGS. 3, 4, and 5.

FIG. 6 is a timing diagram illustrating operation of one embodiment of the local block enables, the block enable small, and the block enable large as illustrated in FIG. 5. A similar timing diagram may apply to the embodiment of FIG. 3, where the block enable small is the block enable from the power manager 18 and the block enable large is omitted. Clock cycles of the BE_Clk are delimited by vertical dashed lines in FIG. 6.

In the first BE_Clk clock cycle, the block enable small is asserted (low in this embodiment). In subsequent (consecutive) BE_Clk clock cycles, the BE1 to BE5 local block enables transition low. Once the local block enables have asserted, the block enable large may be asserted.

Figure 7:
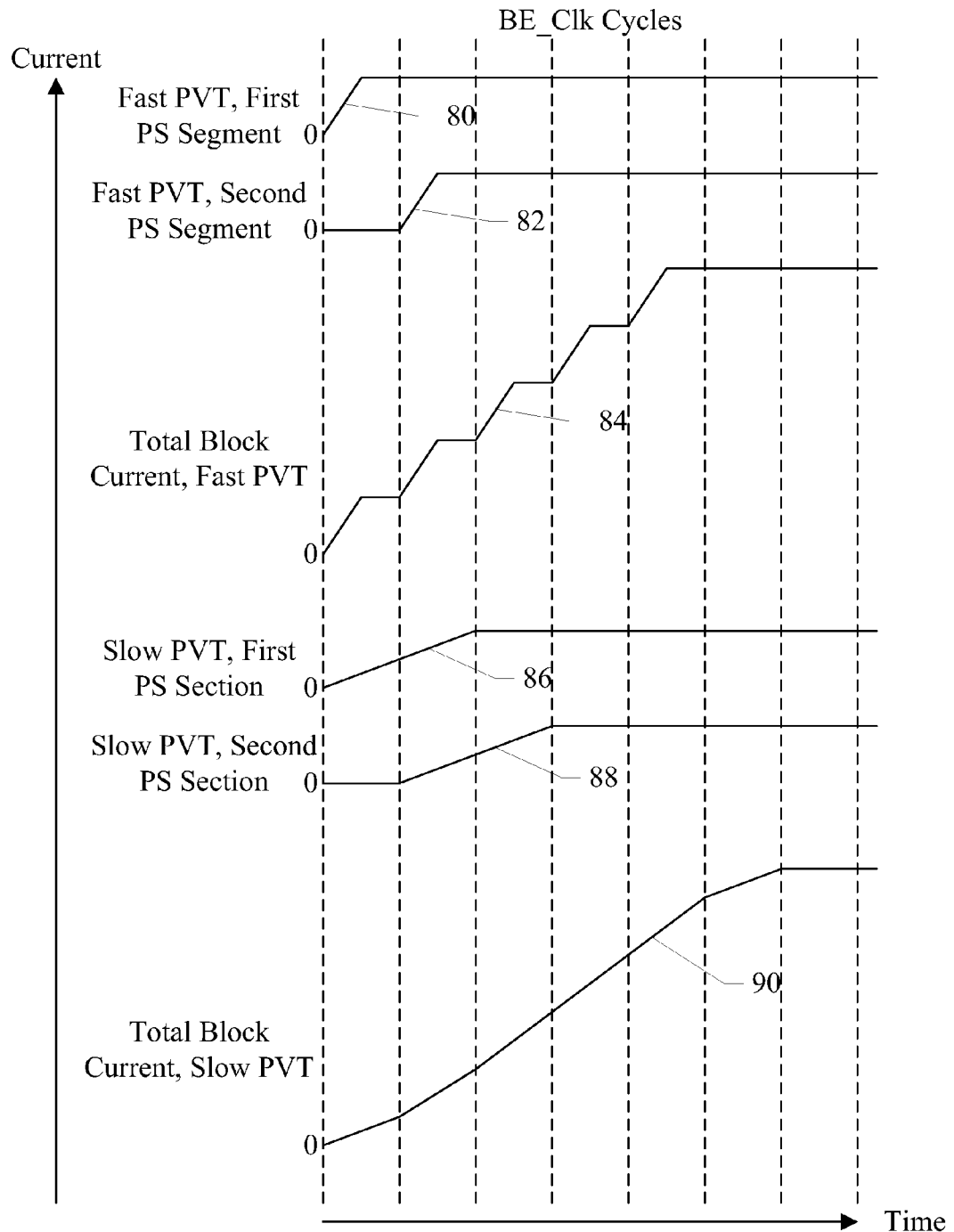
FIG. 7 is a timing diagram illustrating current in an embodiment of the power gated block for exemplary process, voltage, and temperature conditions.

FIG. 7 is a timing diagram illustrating increases in current over time to turn on a power gated block, for both a fast PVT case and a slow PVT case. Similar to FIG. 6, BE_Clk clock cycles are delimited in FIG. 7 via vertical dashed lines. In this example, the BE_Clk clock frequency is set at ½ of the frequency that could be supported in the best case PVT conditions. Accordingly, the current for a given power switch segment may ramp in about ½ of a clock cycle of the BE_Clk when PVT conditions indicate fast operation. This is shown as the "Fast PVT, first PS Segment" wave form for the power switch segment 20A and the "Fast PVT, second PS segment" wave form for the power switch segment 20B. The segment 20A receives its block enable in the first BE_Clk clock cycle illustrated in FIG. 7, and the segment 20B receives its block enable in the second BE_Clk clock cycle. Accordingly, the current in the power switch segment 20A ramps in the first BE_Clk clock cycle and the current in the power switch segment 20B ramps in the second BE_Clk clock cycle (reference numerals 80 and 82, respectively).

Below the wave forms for the segments 20A-20B for the fast case, the total current for the power gated block is shown (reference numeral 84). The total current may be the sum of the currents from each segment, and thus increases each clock cycle as the local block enable of another segment is activated. After 5 BE_Clk cycles in this example, the block is powered up.

On the other hand, the current may change more slowly for slower PVT conditions. For example, a slow PVT case for the first and second segments 20A-20B are illustrated in which two BE_CLK cycles of delay occur prior to completing the power up of a given segment. Accordingly, the slow PVT case for segment 20A ("Slow PVT, First PS segment" in FIG. 7) begins in the first BE_Clk cycle and extends to the second (reference numeral 86). The slow PVT case for segment 20B ("Slow PVT, Second PS segment" in FIG. 7) begins in the second BE_Clk cycle and extends to the third (reference numeral 88). Accordingly, the change in current for the power switch segments 20A and 20B is additive in the second clock cycle. Similarly, the change in current for other power switch segments may overlap and add in other clock cycles through the fifth clock cycle in FIG. 7. However, the total di/dt (see "Total Block Current, Slow PVT" in FIG. 7, reference numeral 90) still meets the requirements. Additionally, the ramp finishes one clock cycle later for the slow PVT case in FIG. 7. As mentioned previously, in the slowest PVT case, the turn on time may be equal to the number of BE_Clk cycles equal to the number of flops plus one delay corresponding to a power switch segment at the slowest PVT condition.

Figure 8:
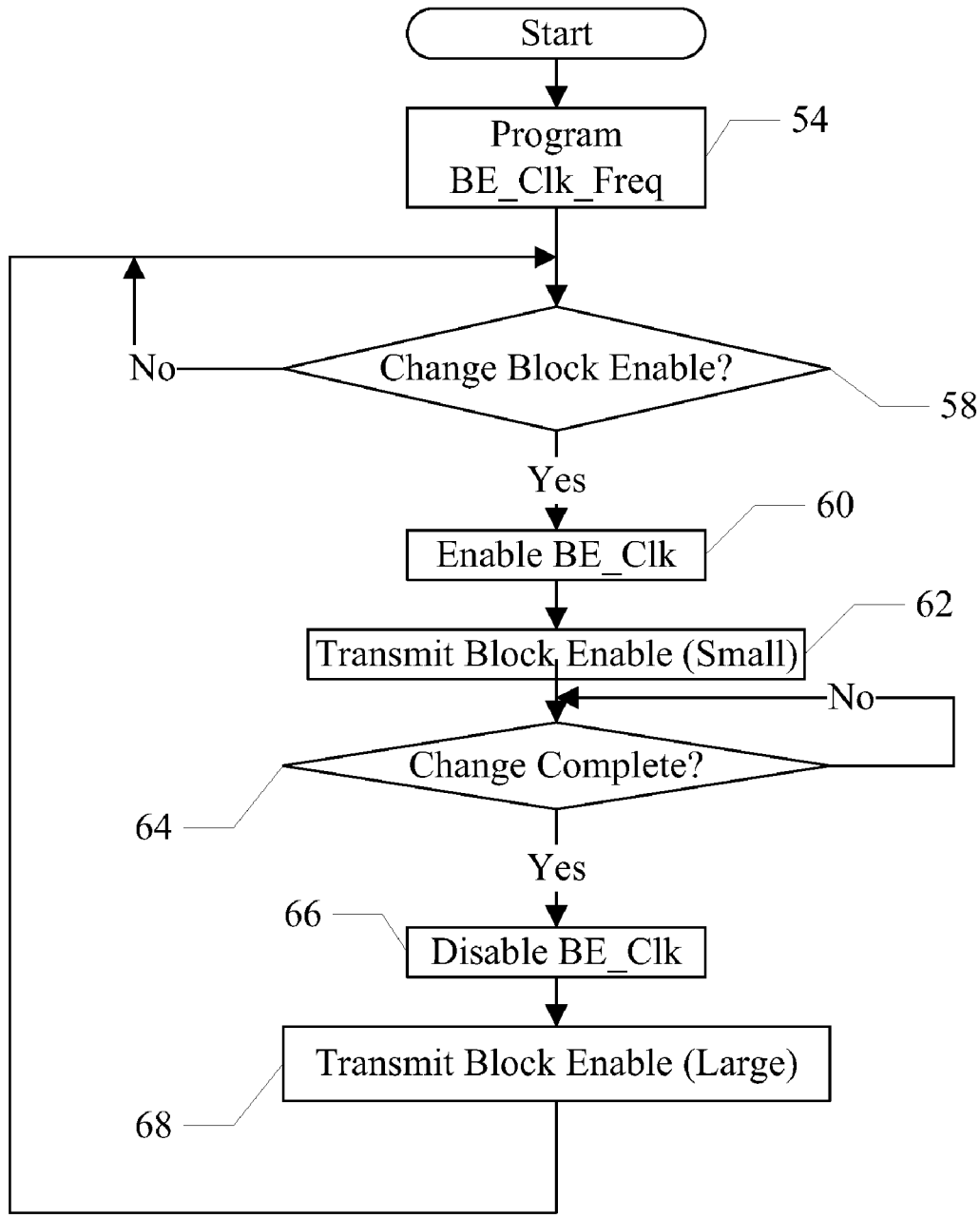
FIG. 8 is a flowchart illustrating operation of one embodiment of a power manager illustrated in FIG. 1 and/or instructions executable on a processor in the integrated circuit.

Turning next to FIG. 8, a flowchart is shown illustrating operation of one embodiment of the power manager 18 and/or power control code that may be executable on a processor in the integrated circuit 10 or coupled to the integrated circuit 10. While the blocks are shown in a particular order for ease of understanding, other orders may be used. Blocks implemented by the power manager 18 may be performed in parallel in combinatorial logic circuits in the power manager 18. Blocks, combinations of blocks, and/or the flowchart as a whole may be pipelined over multiple clock cycles. The power control code may comprise instructions which, when executed by the processor, implement the operation described below.

The power control code may program the BE_Clk_Freq register 17 to select the BE_Clk clock frequency (block 54). Particularly, the selected frequency may be about ½ of the frequency that may be possible at the fastest PVT conditions. The selected frequency may be used for any PVT conditions in the integrated circuit 10. In one embodiment, the frequency may be determined by reading fuses blown during manufacture of the integrated circuit or may be provided in some other non-volatile fashion. In other embodiments, the programmability of the frequency may be used for flexibility in the implementation.

If a change in the block enable for a power managed block is to be performed (decision block 58, "yes" leg), the power manager 18 may enable the BE_Clk (block 60). In this embodiment, the BE_Clk may only be enabled (i.e. toggling) during times that the block enable is changing state. During other times, the BE_Clk may be disabled (not toggling). Power may be conserved by not toggling the BE_Clk when not needed. Other embodiments may not enable and disable the BE_Clk. The block enable may change from enabled to disabled or from disable to enabled to be detected as a change with respect to decision block 58. The power manager 18 may monitor, in hardware, the activity within the integrated circuit 10 and may determine that a block enable is to be changed responsive to the monitoring. Alternatively, the power control code may perform the monitoring and may write a register in the power manager 18 to cause the block enable change.

The power manager 18 may transmit the block enable (or the block enable small, for the embodiment shown in FIG. 5—block 62). Once the change is completed, such as after enough clock cycles of the BE_Clk to have propagated the block enable and charged the local power grid in the enabled block (decision block 64, "yes" leg), the power manager 18 may disable the BE_Clk (block 66). Additionally, in embodiments that implement a second block enable for the large power switch transistors, the power manager 18 may transmit the block enable large (block 68). Embodiments that use flops to transmit the block enable large may not disable the BE_Clk until the block enable large has been propagated, similar to the block enable small discussion above.

The operation illustrated via blocks 58-68 in FIG. 8 may be performed for either change of the block enable. That is, responsive to a determination that a power gated block is to be enabled (powered up), the power manager may enable the BE_Clk and assert the block enable to the block. The power control circuit 24 and the flops 30A-30E may activate the power switches. Responsive to a determination that the power gated block is to be disabled (powered down), the power manager may enable the BE_Clk and deassert the block enable to the block. The power control circuit 24 and the flops 30A-30E may deactivate the power switches. Alternatively, the force off signal may be used to disable the block as discussed above.

Figure 9:
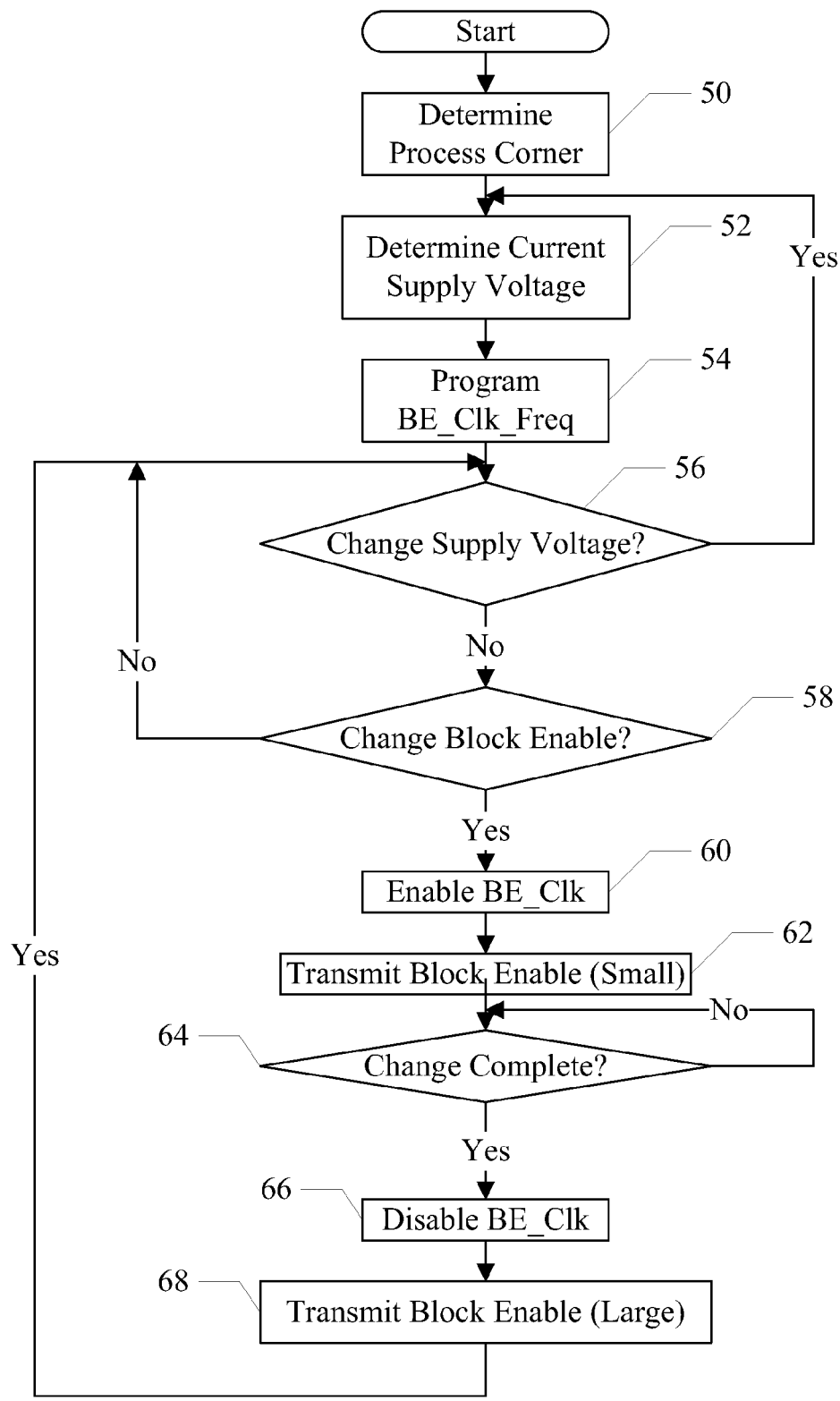
FIG. 9 is a flowchart illustrating operation of another embodiment of a power manager illustrated in FIG. 1 and/or instructions executable on a processor in the integrated circuit.

Turning now to FIG. 9, a flowchart is shown illustrating operation of another embodiment of the power manager 18 and/or power control code that may be executable on a processor in the integrated circuit 10 or coupled to the integrated circuit 10. This embodiment may be used, e.g., if the BE_Clk frequency is adjusted based on PVT conditions. While the blocks are shown in a particular order for ease of understanding, other orders may be used. Blocks implemented by the power manager 18 may be performed in parallel in combinatorial logic circuits in the power manager 18. Blocks, combinations of blocks, and/or the flowchart as a whole may be pipelined over multiple clock cycles. The power control code may comprise instructions which, when executed by the processor, implement the operation described below.

The power control code may determine the process corner that applies to the integrated circuit 10 (e.g. based on the process parameters that were in effect at the time the integrated circuit 10 was manufactured) (block 50). Data identifying the process corner may be available in the integrated circuit 10 (e.g. in the form of fuses blown during manufacture), and may be read by the power control code. The power control code may also determine the current supply voltage (block 52). The ramp rate (di/dt) through the power switches may be dependent on the supply voltage magnitude and/or its position within the allowable supply voltage magnitudes. In some embodiments, the integrated circuit 10 may also make temperature measurements and make temperature data available to be read by the power control code. Based on the process, voltage, and/or temperature parameters, the power control code may program the BE_Clk_Freq register 17 to select the BE_Clk clock frequency (block 54). If the supply voltage is changed (decision block 56, "yes" leg), the power control code may determine the supply voltage magnitude and reprogram the BE_Clk_Freq register 17 accordingly (blocks 52 and 54). Similarly, in response to a change in temperature (if implemented), the power control code may reprogram the BE_Clk_Freq register 17. Alternatively, as mentioned previously, the same BE_Clk frequency may be used for any PVT conditions, and the power control code may program the BE_Clk_Freq register 17 to the frequency (or the frequency may be fixed in hardware and may not be programmed).

If a change in the block enable for a power managed block is to be performed (decision block 58, "yes" leg), the power manager 18 may enable the BE_Clk (block 60). In this embodiment, the BE_Clk may only be enabled (i.e. toggling) during times that the block enable is changing state. During other times, the BE_Clk may be disabled (not toggling). Power may be conserved by not toggling the BE_Clk when not needed. Other embodiments may not enable and disable the BE_Clk. The block enable may change from enabled to disabled or from disable to enabled to be detected as a change with respect to decision block 58. The power manager 18 may monitor, in hardware, the activity within the integrated circuit 10 and may determine that a block enable is to be changed responsive to the monitoring. Alternatively, the power control code may perform the monitoring and may write a register in the power manager 18 to cause the block enable change.

The power manager 18 may transmit the block enable (or the block enable small, for the embodiment shown in FIG. 5—block 62). Once the change is completed, such as after enough clock cycles of the BE_Clk to have propagated the block enable and charged the local power grid in the enabled block (decision block 64, "yes" leg), the power manager 18 may disable the BE_Clk (block 66). Additionally, in embodiments that implement a second block enable for the large power switch transistors, the power manager 18 may transmit the block enable large (block 68). Embodiments that use flops to transmit the block enable large may not disable the BE_Clk until the block enable large has been propagated, similar to the block enable small discussion above.

It is noted that, while the above embodiments illustrated a fixed number of power switches coupled to each local block enable, the number of power switches may be programmable based on the process parameters (e.g. including logic in the propagation of the local block enables to power switches). Additionally, the clock frequency of the BE_Clk may be varied dynamically during power ramping to further control the ramp rate, if desired.

System and Computer Accessible Storage Medium

Figure 10:
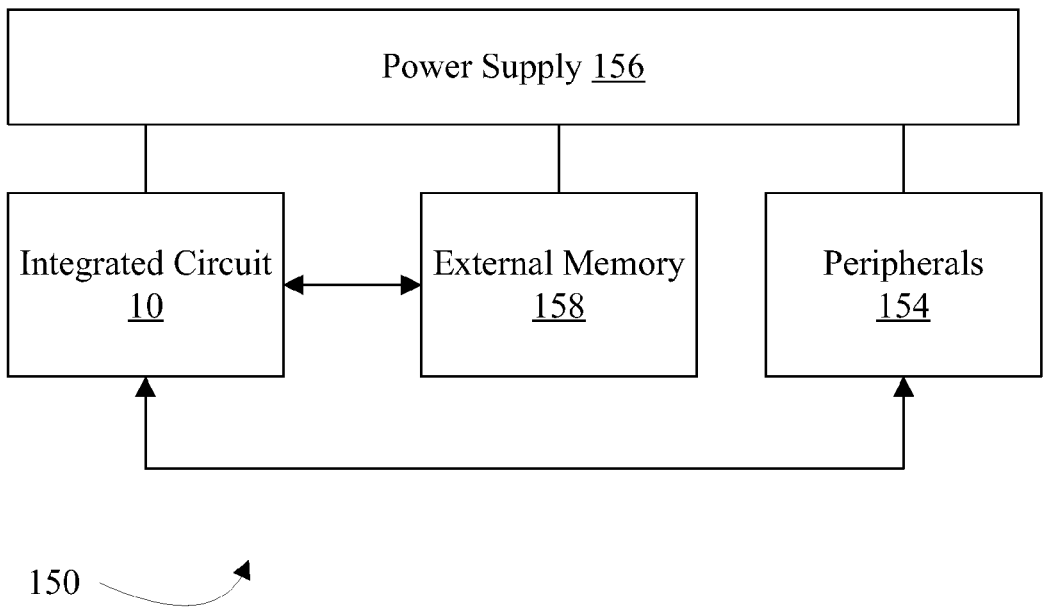
FIG. 10 is a block diagram of one embodiment of a system including the apparatus illustrated in FIG. 1.

Turning next to FIG. 10, a block diagram of one embodiment of a system 150 is shown. In the illustrated embodiment, the system 150 includes at least one instance of an integrated circuit 10 (from FIG. 1) coupled to one or more peripherals 154 and an external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Figure 11:
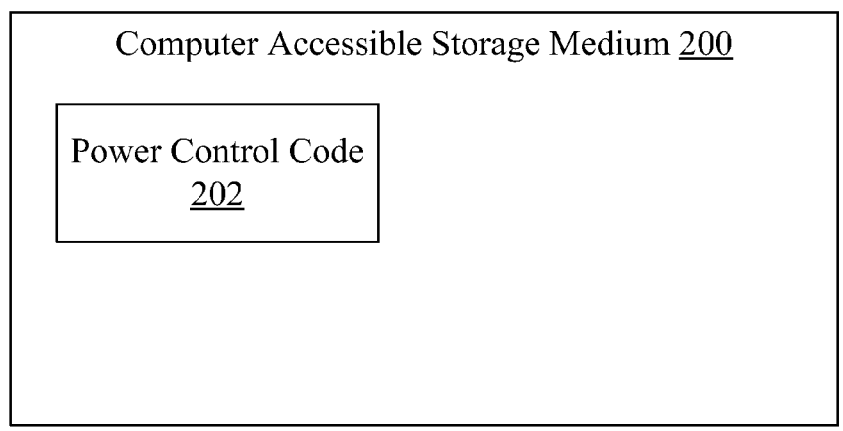
FIG. 11 is a block diagram of one embodiment of a computer accessible storage medium.

Turning now to FIG. 11, a block diagram of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, a flash memory interface (FMI), a serial peripheral interface (SPI), etc. Storage media may include microelectromechanical systems (MEMS), as well as storage media accessible via a communication medium such as a network and/or a wireless link. The computer accessible storage medium 200 in FIG. 11 may store power control code 202. The power control code 202 may include instructions which, when executed, implement the operation described above with regard to FIGS. 8 and/or 9. Generally, the computer accessible storage medium 200 may store any set of instructions which, when executed, implement a portion or all of the operation shown in FIGS. 8 and/or 9. A carrier medium may include computer accessible storage media as well as transmission media such as wired or wireless transmission.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a plurality of power switches coupled to a supply voltage node and configured to provide supply voltage to a circuit block responsive to a plurality of enables, wherein each of the plurality of power switches is coupled to one of the plurality of enables; and
a power control circuit configured to generate the plurality of enables for the plurality of power switches responsive to an input block enable, wherein the power control circuit comprises a plurality of series-connected clocked storage devices, wherein a first clocked storage device of the plurality of series-connected clocked storage devices is coupled to receive the input block enable, and wherein an output of each of the plurality of series-connected clocked storage devices corresponds to one of the plurality of enables, and wherein the plurality of series-connected clocked storage devices are clocked by a clock signal, wherein a clock period of the clock signal is greater than a propagation delay from the output of one of the plurality of series-connected clocked storage devices to the plurality of power switches that are controlled by that output.

2. The integrated circuit as recited in claim 1 wherein the output of each of the plurality of series-connected clocked storage devices is one of the plurality of enables.

3. The integrated circuit as recited in claim 1 further comprising a plurality of buffers coupled to receive a respective one of the plurality of enables and configured to provide the buffered enable to a subset of the plurality of switches.

4. The integrated circuit as recited in claim 3 further comprising a second plurality of buffers coupled to receive the plurality of buffered enables and configured to provide a second buffered enable to a second subset of the plurality of switches.

5. An integrated circuit comprising:
a power manager circuit configured to assert a block enable to enable a power gated block, and the power manager circuit also configured to generate a block enable clock associated with the power manager circuit; and
the power gated block coupled to receive the block enable, the block enable clock, and a supply voltage, wherein the power gated block comprises a plurality of power switches configured to supply power from the supply voltage to logic circuitry in within the power gated block responsive to the asserted block enable, wherein the power gated block is configured to enable different subsets of the plurality of power switches during a plurality of clock cycles of the block enable clock, and wherein each of the different subsets is coupled to receive an enable generated from an output of a corresponding clocked storage device in a daisy-chain configuration of clocked storage devices, wherein the daisy-chain is coupled to receive the asserted block enable.

6. The integrated circuit as recited in claim 5 wherein the power manager circuit is configured to enable the block enable clock responsive to determining that a change in state of the block enable is to be performed, and wherein the power manager circuit is configured to disable the block enable clock responsive to propagating the change in state to each of the plurality of switches.

7. The integrated circuit as recited in claim 5 wherein a frequency of the block enable clock is programmable in the power manager circuit.

8. The integrated circuit as recited in claim 5 further comprising a second plurality of power switches, wherein the power manager circuit is configured to generate a second block enable corresponding to the second plurality of switches, and wherein the power manager circuit is configured to assert the second block enable subsequent to the plurality of clock cycles of the block enable clock.

9. The integrated circuit as recited in claim 5 wherein the daisy-chain configuration comprises logic circuitry coupled to receive an output of the corresponding clocked storage device and one or more additional input signals, wherein the logic circuitry is configured to override the output responsive to assertion of one of the additional input signals.

10. A method comprising:
determining that a power gated block in an integrated circuit is to be powered up;
asserting a block enable and enabling an enable clock to the power gated block responsive to the determining; and
activating a plurality of power switch segments in the power gated block responsive to the asserted enable, wherein the activating comprises activating each power switch segment in a different clock cycle of the enable clock responsive to an output of a clocked storage device from a series connection of clocked storage devices that propagate the asserted enable responsive to the enable clock.

11. The method as recited in claim 10 wherein the different clock cycles are consecutive clock cycles.

12. The method as recited in claim 10 further comprising:
determining that a power gated block is to be powered down;
deasserting a block enable and enabling an enable clock responsive to the determining; and
deactivating a plurality of power switch segments responsive to the deasserted enable, wherein the deactivating comprises deactivating each power switch segment on a different clock cycle of the enable clock.

13. The method as recited in claim 10 further comprising programming a frequency of the enable clock responsive to a magnitude of the supply voltage provided to the integrated circuit.

14. The method as recited in claim 13 further comprising:
detecting that the magnitude of the supply voltage is being changed; and
changing the frequency of the enable clock responsive to the detecting.

15. An integrated circuit comprising:
a plurality of power switch segments, wherein each of the plurality of power switch segments comprise a first plurality of power switches controlled by a first block enable signal and a second plurality of power switches controlled by a second block enable; and
a power control circuit coupled to receive the first block enable signal, the second block enable signal, and a clock signal, and wherein the power control circuit is coupled to the plurality of power switch segments, and wherein the power control circuit is configured to cause each of the first plurality of power switches to enable responsive to an assertion of the first block enable signal, the power control circuit configured to cause the plurality of power switches in each of the plurality of power switch segments to enable in different clock cycles of the clock signal, and wherein the power control circuit is configured to cause the second plurality of power switches in the plurality of power switch segments to enable concurrently in response to an assertion of the second block enable signal.

16. The integrated circuit as recited in claim 15 wherein each of the plurality of power segments is configured to cause, during an enable or disable of the first plurality of power switches, a change in current per unit of time that is less than a specified amount at a best case process/voltage/temperature condition of the integrated circuit.

17. The integrated circuit as recited in claim 16 wherein a clock period of the clock signal is at least as large as a propagation delay through one of the plurality of power segments for a signal that enables the first plurality of power switches.

18. The integrated circuit as recited in claim 15 wherein the clock signal is separate from a second one or more clock signals used by the logic circuitry in a power gated block that includes the plurality of power switch segments.

19. A non-transitory computer accessible storage medium storing a plurality of instructions which, when executed, program a clock frequency for a block enable clock in an integrated circuit, wherein a power gated block in the integrated circuit is coupled to receive the block enable clock and is configured to enable subsets of power switches within the power gated block in respective clock cycles of the block enable clock to control a rate of change of power supply current in the power gated block.

20. The non-transitory computer accessible storage medium as recited in claim 19 wherein the plurality of instructions, when executed, determine a process corner that applies to the integrated circuit, wherein the clock frequency is dependent on the process corner.

21. The non-transitory computer accessible storage medium as recited in claim 20 wherein a first frequency corresponds to a clock period that is approximately a length of a propagation delay for an enable signal through a given subset of the power switches, and wherein the plurality of instructions, when executed, program the clock frequency as approximately ½ of the first frequency.

22. The non-transitory computer accessible storage medium as recited in claim 19 wherein the plurality of instructions, when executed, determine a magnitude of the power supply voltage supplied to the integrated circuit, wherein the clock frequency is dependent on the magnitude of the supply voltage.

* * * * *